United States Patent
Lee

(10) Patent No.: US 7,596,735 B2
(45) Date of Patent: Sep. 29, 2009

(54) PAD UNIT HAVING A TEST LOGIC CIRCUIT AND METHOD OF DRIVING A SYSTEM INCLUDING THE SAME

(75) Inventor: Jae-Hoon Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/945,352

(22) Filed: Nov. 27, 2007

(65) Prior Publication Data
US 2008/0133991 A1 Jun. 5, 2008

(30) Foreign Application Priority Data
Nov. 30, 2006 (KR) .................. 10-2006-0119409

(51) Int. Cl.
*G01R 31/28* (2006.01)
(52) U.S. Cl. .................................... 714/727
(58) Field of Classification Search ................ 714/726, 714/727
See application file for complete search history.

(56) References Cited

U.S. PATENT DOCUMENTS 5,202,625 A * 4/1993 Farwell ...................... 714/727
5,717,700 A * 2/1998 Crouch et al. ............... 714/726
6,226,779 B1 * 5/2001 Baxter et al. ................. 716/16
6,271,700 B1 * 8/2001 Itaya .......................... 327/202
6,680,622 B2 * 1/2004 Zounes ......................... 326/16
7,219,281 B2 * 5/2007 Dubey ........................ 714/727

FOREIGN PATENT DOCUMENTS

| JP | 09-211074 | 8/1997 |
| JP | 2003-110417 | 4/2002 |
| KR | 1020040110317 A | 12/2004 |
| KR | 1020060011501 A | 2/2006 |

OTHER PUBLICATIONS

Office Action dated Jan. 28, 2008 from Korean Intellectual Property Office in corresponding KR Patent Application No. 2006-119409.

* cited by examiner

*Primary Examiner*—James C Kerveros
(74) *Attorney, Agent, or Firm*—F. Chau & Assoc., LLC

(57) ABSTRACT

Noise may cause malfunction and reduction of yield in semiconductor devices operating with a low supply voltage, and a logic test is generally performed for testing characteristics of input/output pads. In the logic test, High Level Input Voltage (VIH), Low Level Input Voltage (VIL), and Input Signal Fault Detection may be considered. In a normal operation mode, the noise propagates through a logic chain by toggling of the test logic circuit, and a circuit can prevent the noise propagation using logical operations. Thus, a characteristic degradation due to the noise propagation may be reduced.

15 Claims, 5 Drawing Sheets

PAD UNIT HAVING A TEST LOGIC CIRCUIT AND METHOD OF DRIVING A SYSTEM INCLUDING THE SAME

CROSS-REFERENCE TO RELATED APPLICATION

This application claims priority under 35 USC § 119 to Korean Patent Application No. 2006-119409, filed on Nov. 30, 2006 in the Korean Intellectual Property Office (KIPO), the disclosure of which is incorporated herein in its entirety by reference.

BACKGROUND OF THE INVENTION

1. Technical Field

The present disclosure relates to a pad having a test logic circuit for a chain test and, more particularly, to a pad unit having a test logic circuit for preventing noise propagation through a test chain and a method of driving a system including the pad.

2. Discussion of Related Art

A logic test is typically performed to check a characteristic of input/output pads. Using such a logic test may reduce the time and cost of separately testing the pins of a semiconductor device. A logic chain may be used for the logic test. In the logic test input/output pads, High Level Input Voltage (VIH), Low Level Input Voltage (VIL), and Input Signal Fault Detection may be considered.

FIGS. 1A and 1B are diagrams illustrating conventional input pads.

Referring to FIG. 1, an input pad 110 does not include a logic circuit. Thus, a chain test is performed after connecting an external logic chain (not shown) between the input pad 110 and an output pad (not shown) at Y in a logic test mode.

The input pad 110 is used only for a normal operation mode of receiving an input signal, and cannot provide a test function. A designer of a semiconductor device may connect an external test logic circuit, such as at Y, to the input pad 110 as a logic chain to test a signal characteristic of the input pad 110.

Referring to FIG. 1B, a test logic circuit having a NAND gate 130 is coupled to an input pad 120. In this situation, the designer of the semiconductor device does not need the external test logic circuit when using the pad 120 having the test logic circuit as shown in FIG. 1B.

The test logic circuit having the NAND gate 130 may form a logic chain with test logic circuits of other pads connected at Y. The NAND gate 130 included in the test logic circuit shown in FIG. 1B may be referred to as a NAND Primitive for a NAND gate logic chain and has a second input SI from a preceding stage and an output SO.

FIG. 2 is a diagram illustrating a configuration for performing a chain test using the test logic circuit shown in FIG. 1B.

Input stages 210, 220, and 230 may be implemented with input pads 211, 221, and 231, and may further include additional termination resistors that are shown for impedance matching, as well as the buffers that are shown.

Input signals IN_D1, IN_D2, and IN_D3 that are provided through input pads 211, 221, and 231 are ultimately transmitted to an internal circuit (not shown), such as an internal core logic circuit of the system, in a normal operation mode. The input signals IN_D1, IN_D2, and IN_D3 are transmitted to a logic chain 240 in a scan test mode. The input signals IN_D1, IN_D2, and IN_D3 may be provided from an external test device (not shown) in the scan test mode.

Test logic circuits 241, 242, and 243 are respectively coupled to the input pads 211, 221, and 231, and form the logic chain 240, as shown in FIG. 2.

An output unit 250 receives test data from the logic chain 240. The output unit 250 provides a test result OUT_D through a test output pad 251 in response to an output test enable signal OUT_EN.

The chain test using the logic chain 240 is performed as follows.

A first test signal IN_D1 input via an input pad 211 and a chain input signal SI1 from a preceding test logic circuit (not shown) are provided to a first test logic circuit 241. An output signal SO1 of the first test logic circuit 241 is provided to a second test logic circuit 242 as a chain input signal SI2.

A second test signal IN_D2 input via an input pad 221 and the chain input signal SI2 are provided to the second test logic circuit 242. An output signal SO2 of the second test logic circuit 242 is provided to the third test logic circuit 243 as a chain input signal SI3.

A third test signal IN_D3 input via an input pad 231 and the chain input signal SI3 are provided to the third test logic circuit 243. An output signal SO3 of the third test logic circuit 243 is outputted to a test device (not shown) through an output pad 251 of the output unit 250 in response to an output test enable signal OUT_EN. The test device (not shown) checks whether the output signal OUT_D of the output unit 250 corresponds to an expected value, and determines whether the chain test is successful.

The normal operation may be performed after the chain test is determined to be successful, and the input signals IN_D1, IN_D2, and IN_D3 provided through the input pads 211, 221, and 231 may be transmitted to the internal core logic circuit (not shown).

The logic chain 240 can adversely influence the input signal in the normal operation mode because a noise component in the input signals may propagate through the logic chain 240.

For example, when a clock signal having a bandwidth of 1 Mhz to 100 Mhz is provided to a phase-locked-loop circuit, an initially generated low-level noise may be amplified due to a generation of signals having the same phases, and the amplified noise may cause a malfunction. This influence of noise may be ignored in the case that the power-supply voltage is a very high level. Many recent semiconductor devices, however, need to operate at a low power-supply voltage to achieve low cost, high speed and low power consumption. The adverse influence of the noise becomes more serious as the power-supply voltage is lowered.

SUMMARY OF THE INVENTION

Accordingly, exemplary embodiments of the present invention are provided to substantially obviate one or more problems due to limitations and disadvantages of the related art.

Some exemplary embodiments of the present invention provide a method of driving a system capable of performing a chain test using a pad unit having a test logic circuit for a chain test.

Some exemplary embodiments of the present invention provide a pad unit for a chain test capable of preventing noise propagation in the normal operation mode.

In some exemplary embodiments of the present invention, a method of driving a system comprises performing a chain test using a pad and a logic chain in a test mode, and disabling the logic chain to prevent noise propagation by the logic chain in a normal operation mode.

The logic chain may be controlled in response to a chain control signal for preventing the noise propagation.

The pad may correspond to one of an input pad, an output pad, and a bi-directional input/output pad.

In exemplary embodiments of the present invention, a pad unit for a chain test of a system comprises a pad for transmitting a signal between an external device of the system and an internal core logic circuit of the system, and a test logic circuit coupled to the pad to receive the signal, the test logic circuit is configured to perform the chain test in response to a chain input signal and a chain control signal in a test mode and is configured to be disabled in response to the chain control signal in a normal operation mode.

The chain control signal may enable the test logic circuit in the test mode, and may disable the test logic circuit in the normal operation mode.

A chain output signal corresponding to an output signal of the test logic circuit may have a fixed value in the normal operation mode.

The test logic circuit may include a three-input NAND gate configured to perform a NAND operation upon a chain input signal, the signal from the pad, and the chain control signal.

The test logic circuit may include a switch configured to receive the signal from the pad and to operate in response to the chain control signal, and a NAND gate configured to receive an output of the switch and the chain input signal.

The test logic circuit may include a NAND gate configured to receive the signal from the pad and the chain input signal, and a switch configured to receive an output of the NAND gate, the switch being controlled in response to the chain control signal.

The switch may correspond to a three-state buffer. The switch corresponds to an MOS transistor.

The pad unit may correspond to one of an input pad, an output pad, and a bi-directional input/output pad.

BRIEF DESCRIPTION OF THE DRAWINGS

Exemplary embodiments of the present invention will be understood in more detail from the following descriptions taken in conjunction with the accompanying drawings.

DETAILED DESCRIPTION OF EXEMPLARY EMBODIMENTS

Figure 1A:
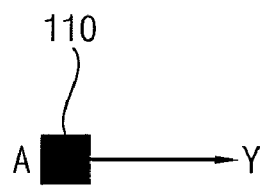
FIG. 1A is a diagram illustrating a conventional input pad.
Figure 1B:
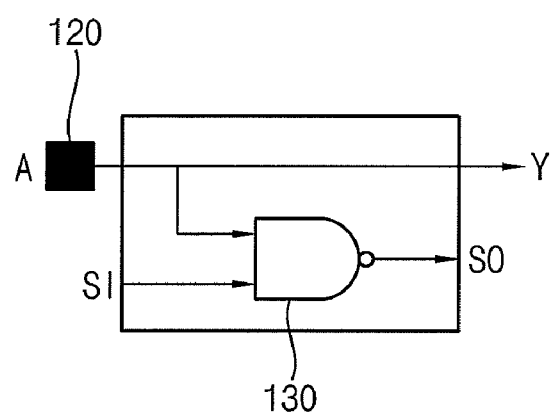
FIG. 1B is a diagram illustrating a conventional input pad having a test logic circuit.

Exemplary embodiments of the present invention now will be described more fully with reference to the accompanying drawings, in which exemplary embodiments of the present invention are shown. This invention may, however, be embodied in many different forms and should not be construed as limited to the exemplary embodiments set forth herein. Rather, these exemplary embodiments are provided so that this disclosure will be thorough and complete, and will fully convey the scope of the present invention to those of ordinary skill in the art. Like reference numerals refer to like elements throughout the drawings.

To prevent the degradation of a signal caused by noise that is generated by test logic circuits and that propagates through a logic chain, the test logic circuit added to a pad for a test responsive to a chain control signal is subsequently disabled in a normal operation mode. For example, the system performs a chain test, then the system performs a normal operation mode after disabling the test logic circuits in response to the chain control signal, thereby to prevent the noise propagation.

Figure 3A:
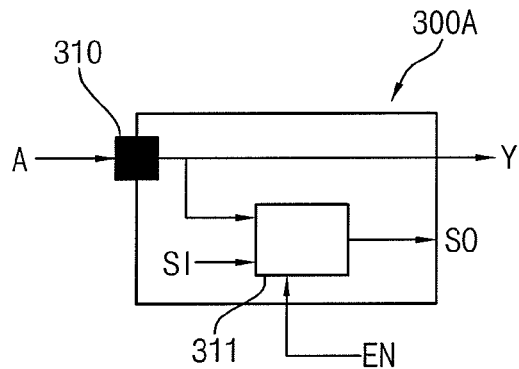
FIG. 3A is a diagram illustrating an input pad unit according to an exemplary embodiment of the present invention.
Figure 3B:
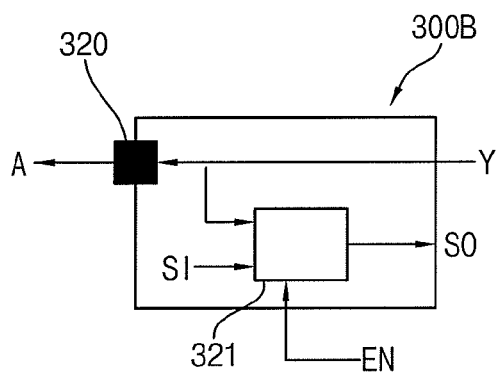
FIG. 3B is a diagram illustrating an output pad unit according to an exemplary embodiment of the present invention.
Figure 3C:
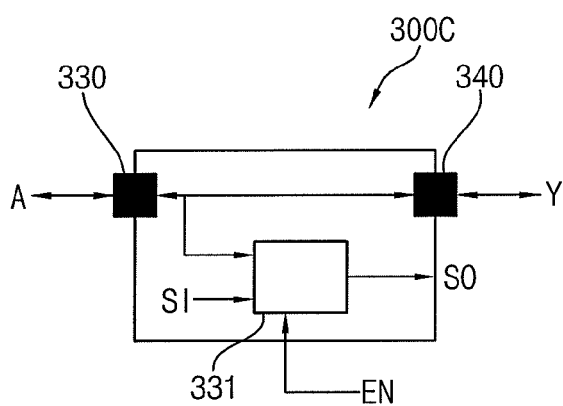
FIG. 3C is a diagram illustrating a bi-directional input/output pad unit according to an exemplary embodiment of the present invention.

FIGS. 3A, 3B, and 3C are diagrams illustrating an input pad unit 300A, an output pad unit 300B, and an input/output pad unit 300C, respectively, each of which includes a test logic circuit.

Comparing the pad units shown in FIGS. 3A, 3B and 3C having the test logic circuit with the conventional pad having a test logic circuit, the pad units having the test logic circuit according to exemplary embodiments of the present invention have a distinctive feature in that the test logic circuit can be controlled in response to a chain control signal.

The input pad unit 300A having the test logic circuit 311 capable of reducing noise is illustrated in FIG. 3A. The input pad unit 300A receives three signals A, SI and EN. A signal Y represents an input pad output signal provided to an internal core logic circuit (not shown). The signal A represents an external input signal provided from outside of the input pad unit 300A to the input pad 310. The signal SI represents a chain output signal provided from a preceding input pad unit (not shown). The chain control signal EN maintains a first logic value to enable the test logic circuit 311 in a chain test mode. The chain control signal EN maintains a second logic value to disable the test logic circuit 311 in a normal operation mode. The normal operation is performed after finishing the chain test. In an exemplary embodiment, the first logic value may correspond to a logic '1', and the second logic value may correspond to a logic '0'. In another exemplary embodiment, the first logic value may correspond to a logic '0', and the second logic value may correspond to a logic '1'.

The input pad unit 300A includes the input pad 310 and the test logic circuit 311. The input pad 310 receives the signal A from outside of the input pad unit 300A. The test logic circuit 311 receives the signal A provided through the input pad 310, the signal S1 from the preceding input pad unit (not shown), and the chain control signal EN, and generates the chain output signal SO.

In an exemplary embodiment, the chain output signal SO may have a predetermined value when the test logic circuit 311 is disabled by the chain control signal EN. For example, the test logic circuit 311 may generate the logic '1' or the logic '0' when the test logic circuit 311 is disabled.

In another exemplary embodiment, the chain output signal SO may be in a floating state when the test logic circuit 311 is disabled, so that the test logic circuits in the logic chain may be isolated from each other.

The output pad unit 300B having the test logic 321 capable of reducing noise propagation is illustrated in FIG. 3B. The output pad unit 300B receives three signals Y, SI and EN. A signal A represents an output signal provided to the outside of the output pad unit 300B through the output pad 320. The signal Y represents a signal provided from the internal core logic circuit to the output pad 320. The signal SI represents a signal from the preceding output pad unit (not shown). The chain control signal EN maintains a first logic value to enable the test logic circuit 321 in a chain test mode. The chain control signal EN then maintains a second logic value to disable the test logic circuit 321 in a normal operation mode. The normal operation is performed after finishing the chain test. In an exemplary embodiment, the first logic value may correspond to a logic '1', and the second logic value may correspond to a logic '0'. In another exemplary embodiment, the first logic value may correspond to a logic '0', and the second logic value may correspond to a logic '1'.

The output pad unit 300B includes the output pad 320 and the test logic circuit 321. The output pad 320 receives a signal Y from the internal core logic circuit (not shown). The test logic circuit 321 receives the signal Y provided to the output pad 320 and the chain control signal EN, and generates a chain output signal SO.

In an exemplary embodiment, the chain output signal SO may have a predetermined value when the test logic circuit 321 is disabled. For example, the test logic circuit 321 may generate the logic '1' or the logic '0' when the test logic circuit 321 is disabled.

In another exemplary embodiment, the chain output signal SO may be in a floating state when the test logic circuit 321 is disabled, so that the test logic circuits in the logic chain may be isolated from each other.

The bi-directional input/output pad unit 300C having a test logic circuit 331 capable of reducing noise propagation is illustrated in FIG. 3C. The bi-directional input/output pad unit 300C receives three signals A, SI and EN. The signal A represents a signal provided from outside of the input/output pad unit 300C through a pad 330. The signal A also may represent a signal provided to the internal core logic circuit (not shown) through the pad 330. A signal Y represents a signal provided to the outside of the input/output pad unit 300C through a pad 340. The signal Y also may represent a signal provided to the internal core logic circuit (not shown) through the pad 340. The signal SI represents a signal from a preceding input/output pad unit (not shown). A chain control signal EN maintains a first logic value to enable the test logic circuit 331 in a chain test mode. The chain control signal EN maintains a second logic value subsequently to disable the test logic circuit 331 in a normal operation mode. The normal operation is performed after finishing the chain test. In an exemplary embodiment, the first logic value may correspond to a logic '1', and the second logic value may correspond to a logic '0'. In another exemplary embodiment, the first logic value may correspond to a logic '0', and the second logic value may correspond to a logic '1'.

The bi-directional input/output pad unit 300C includes pads 330 and 340 and the test logic circuit 331. The pads 330 and 340 may receive a signal from the internal core logic circuit Alternatively, the pads 330 and 340 may provide a signal to the outside of the input/output pad unit 300C. The test logic circuit 331 receives the signal A or the signal Y provided via the pads 330 and 340, and the chain control signal EN, and generates a chain output signal SO.

In an exemplary embodiment, the chain output signal SO may have a predetermined value when the test logic circuit 331 is disabled. For example, the test logic circuit 331 may generate the logic '1' or the logic '0' when the test logic circuit 331 is disabled.

In another exemplary embodiment, the chain output signal SO may be in a floating state when the test logic circuit 331 is disabled, so that the test logic circuits in the logic chain may be isolated from each other.

As described above, the test logic circuits 311, 321, and 331 may be repeatedly enabled in the chain test mode and disabled in the normal operation mode. Thus, noise propagation through the test chain may be reduced in the normal operation mode.

Figure 4:
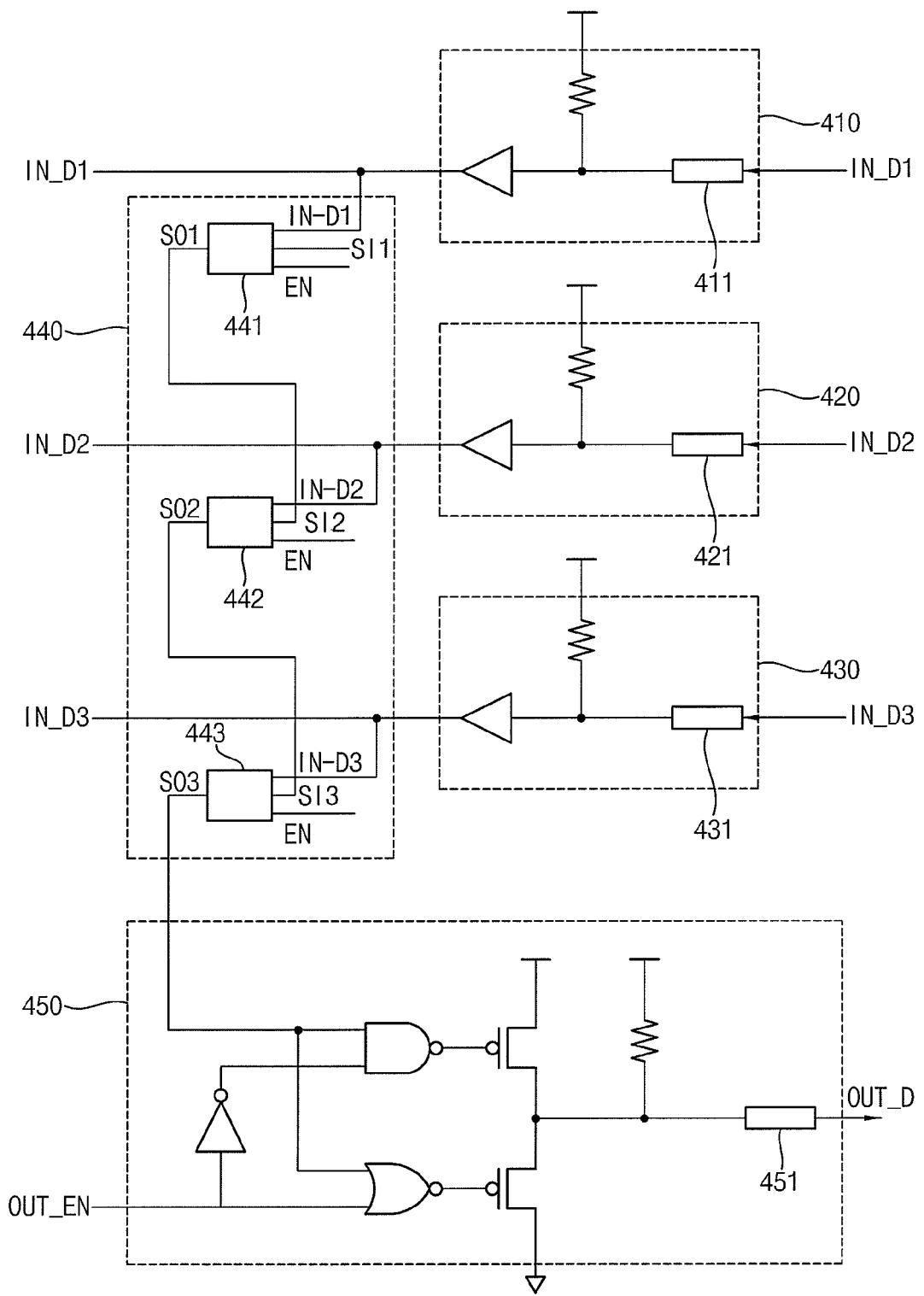
FIG. 4 is a diagram illustrating a configuration for performing a chain test using the pad units shown in FIGS. 3A, 3B, and 3C.

FIG. 4 is a diagram illustrating a configuration for performing a chain test using the pad units shown in FIGS. 3A, 3B, and 3C.

Input stages 410, 420 and 430 may be implemented with single pads and may further include buffers and resistors, as shown, for impedance matching.

Input signals IN_D1, IN_D2 and IN_D3 received through the input pads 411, 421, and 431, respectively, are provided to an internal core logic circuit (not shown) in a normal operation mode. The input signals IN_D1, IN_D2 and IN_D3 are provided through the logic chain 440 in a scan test mode. The input signals IN_D1, IN_D2, and IN_D3 may be provided by an external test device.

Figure 2:
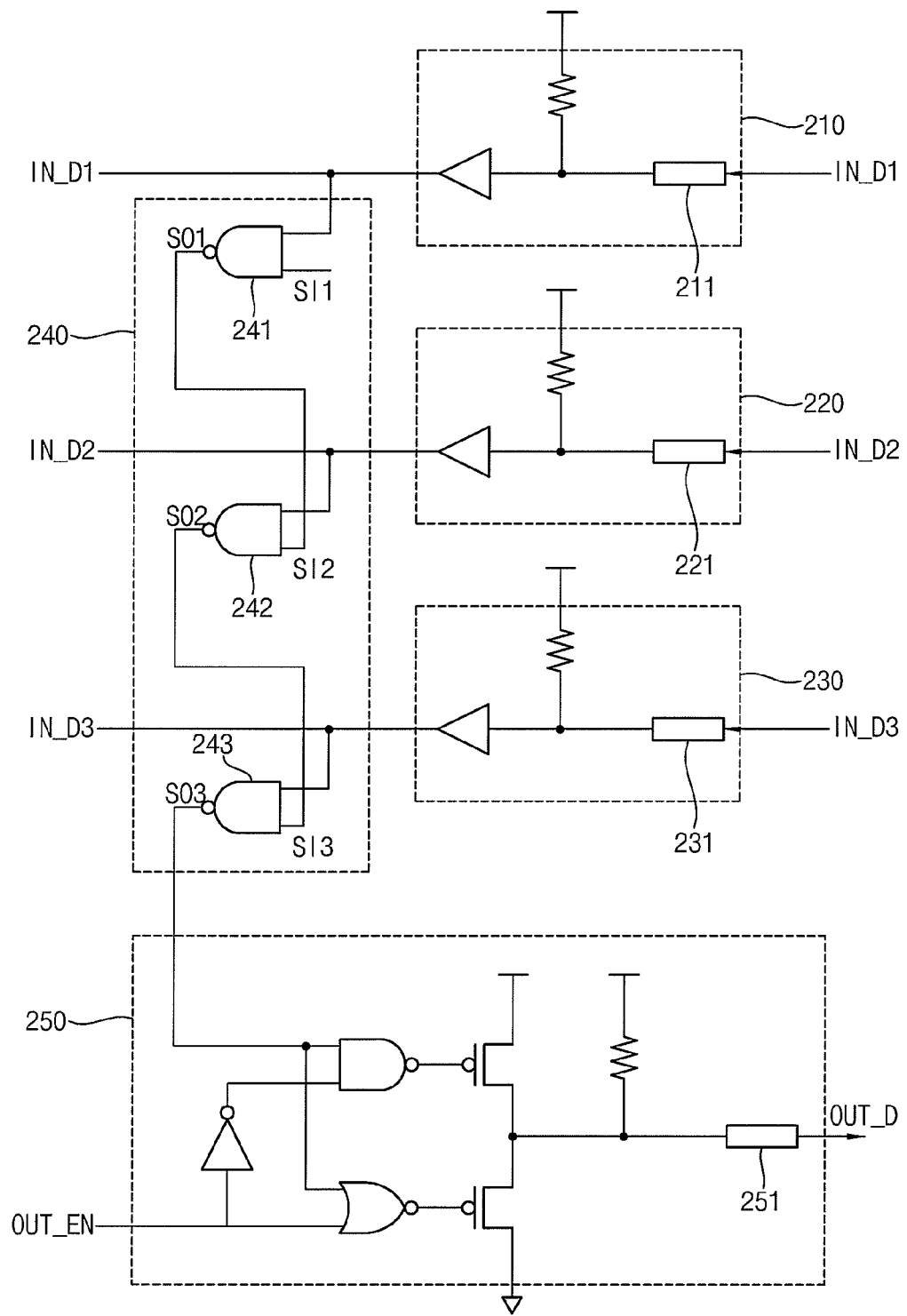
FIG. 2 is a diagram illustrating a configuration for performing a chain test using the test logic circuit shown in FIG. 1B.

Test logic circuits 441, 442, and 443 are respectively coupled to the input pads 411, 421, and 431 and form a logic chain 440, as in the circuit shown in FIG. 2.

An output unit 450 generates test data OUT_D propagated through the logic chain 440. The output unit 450 includes a test output pad 451 for outputting the test data OUT_D.

The chain test using the logic chain 440 may be performed as follows.

A first test signal IN_D1 received via an input pad 411 and the chain input signal SI1 from a preceding logic chain (not shown) are provided to a first test logic circuit 441, along with a chain control signal EN. An output signal SO1 of the first test logic circuit 441 is provided as an input chain signal SI2 of a second test logic circuit 442.

A second test signal IN_D2 received via an input pad 421 and the chain input signal SI2 are provided to the second test logic circuit 442, along with a chain control signal EN. An output signal SO2 of the second test logic circuit 442 is provided as an input chain signal SI3 of a third test logic circuit 443.

A third test signal IN_D3 received via an input pad 431 and the chain input signal SI3 are provided to the third test logic circuit 443, along with a chain control signal EN. An output signal SO3 of the third test logic circuit 443 is provided as an input signal to the output unit 450. A test device (not shown) checks whether the output signal OUT_D of the test output pad 451 corresponds to an expected value, and determines whether the test is successful.

The normal operation is performed after finishing the chain test described above, and the input signals are transmitted to the internal core logic circuit (not shown).

The first test logic circuit 441, the second test logic circuit 442, and the third test logic circuit 443 each receive the chain control signal EN, unlike the test logic circuits 241, 242, and 243 shown in FIG. 2. The chain control signal EN enables the test logic circuits 441, 442, and 443 in the chain test mode, and disables the test logic circuits 441, 442, and 443 in the normal operation mode after finishing the chain test. Thus, adverse influence on the input signal caused by the logic chain 440 can be reduced in the normal operation mode.

The test logic circuits 441, 442, and 443 may be implemented as shown in FIG. 4 to form the logic chain 440, but that is only an exemplary embodiment. The test logic circuits 441, 442 and 443 may be implemented in various configurations. Even though a configuration having the input pads 411, 421, and 431 is described with reference to FIG. 4, other configurations capable of controlling the test logic circuits responsive to the chain control signal may be applicable to the output pad unit and the bi-directional input/output pad unit shown respectively in FIGS. 3B and 3C.

Figure 5A:
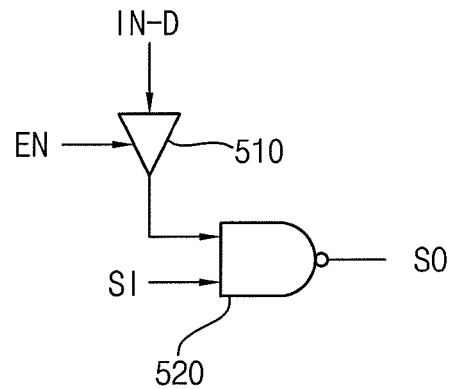
FIGS. 5A, 5B and 5C are diagrams illustrating test logic circuits according to exemplary embodiments of the present invention.
Figure 5B:
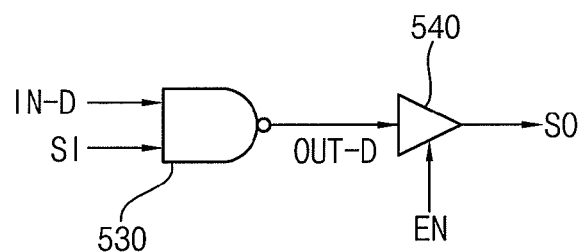
Figure 5C:
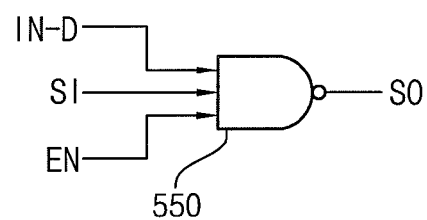

FIGS. 5A, 5B and 5C are diagrams illustrating test logic circuits according to exemplary embodiments of the present invention, which are implemented in a gate level.

FIGS. 5A and 5B illustrate serially coupled structures of two-input NAND gate receiving the chain control signal SI and an input signal IN-D, and a buffer controlled in response to a chain control signal EN.

Referring to FIG. 5A, the buffer 510 may be coupled to one input of a NAND gate 520. The buffer 510 may comprise a three-state buffer, and can be enabled or disabled in response to the chain control signal EN.

The buffer 510 receives the signal IN-D and is controlled in response to the chain control signal EN. The NAND gate 520 receives an output of the buffer 510 and the chain input signal SI, and generates an output signal SO. The output signal SO may be a floating state when the buffer 510 is disabled.

Referring to FIG. 5B, a buffer 540 may be coupled to an output of a NAND gate 530. The buffer 540 may comprise a three-state buffer, and may be enabled or disabled in response to the chain control signal EN.

The NAND gate 530 receives the input signal IN-D and the chain input signal SI. The buffer 540 receives an output of the NAND gate 530, and generates an output signal SO. The buffer 540 can be controlled in response to the chain control signal EN. The buffer 540 generates the output signal SO from the output signal. OUT_D of the NAND gate 530 when the chain control signal is enabled. The buffer 540 may stop generating the output signal SO from the output signal OUT_D of the NAND gate 530 when the chain control signal EN is disabled. Thus, the chain output signal SO may be a floating state.

The three-state buffer may be implemented with a PMOS transistor or a NMOS transistor (not shown) controlled in response to the chain control signal EN.

FIG. 5C illustrates an exemplary implementation of a test logic circuit having a three-input NAND gate 550. The three-input NAND gate receives an input signal IN-D provided through a pad in a normal operation mode, an input signal SI, and a chain control signal EN.

The chain control signal EN corresponds to a logic '1' in the chain test mode, and corresponds to a logic '0' in the normal operation mode. In the chain test mode, the test chain is enabled, then, the chain test is performed. In the normal operation mode, the chain control signal corresponds to a logic '0'. Thus, the output signal SO is fixed as a logic '1' so as not to influence the pad.

As described above, an exemplary embodiment of the present invention may prevent noise from being propagated through the logic chain using the chain control signal in a normal operation mode after finishing the chain test. Thus, performance degradation caused by the noise may be reduced.

While the exemplary embodiments of the present invention and their advantages have been described in detail, it should be understood that various changes, substitutions and alterations may be made herein without departing from the scope of the invention.

What is claimed is:

1. A method of driving a system, comprising:
    performing a chain test using a plurality of pads and a logic chain having plurality of test logic circuits respectively coupled to the plurality of pads to generate test data in a test mode;
    outputting the test data using a test output pad in the test mode;
    disabling each of the test logic circuits in the logic chain to prevent a noise propagation by the logic chain in a normal operation mode; and
    transmitting a signal between the pad and an internal circuit independently of an operation of the logic chain.

2. The method of claim 1, wherein each of the test logic circuits is controlled in response to a chain control signal for preventing the noise propagation.

3. The method of claim 1, wherein the plurality of pads comprises at least one of an input pad, an output pad and a bi-directional input/output pad.

4. A pad unit for a chain test of a system, comprising:
    a pad for transmitting a signal between an external device of the system and an internal core logic circuit of the system; and
    a test logic circuit coupled to the pad to receive the signal, the test logic circuit configured to perform the chain test in response to a chain input signal and a chain control signal in a test mode and configured to be disabled in response to the chain control signal in a normal operation mode,
    wherein the signal is transmitted between the pad and the internal logic circuit independently of an operation of the test logic circuit.

5. The pad unit of claim 4, wherein the chain control signal enables the test logic circuit in the test mode and disables the test logic circuit in the normal operation mode.

6. The pad unit of claim 4, wherein a chain output signal corresponding to an output signal of the test logic circuit has a fixed value in the normal operation mode.

7. The pad unit of claim 4, wherein the test logic circuit includes a three-input NAND gate configured to perform a NAND operation upon the chain input signal, the signal from the pad, and the chain control signal.

8. The pad unit of claim 4, wherein the test logic circuit includes:
    a switch configured to receive the signal from the pad and configured to operate in response to the chain control signal; and
    a NAND gate configured to receive an output of the switch and the chain input signal.

9. The pad unit of claim 8, wherein the switch comprises a three-state buffer.

10. The pad unit of claim 8, wherein the switch comprises an MOS transistor.

11. The pad unit of claim 4, wherein the test logic circuit includes:
    a NAND gate configured to receive the signal from the pad and the chain input signal; and
    a switch configured to receive an output of the NAND gate, the switch being controlled in response to the chain control signal.

12. The pad unit of claim 11, wherein the switch comprises a three-state buffer.

13. The pad unit of claim 12, wherein the switch comprises an MOS transistor.

14. The pad unit of claim 4, wherein the pad comprises one of an input pad, an output pad and a bi-directional input/output pad.

15. A system for a chain test, comprising:
    a plurality of pads for transmitting a signal between each of the plurality of pads and an internal circuit independently of an operation of a logic chain;
    the logic chain having a plurality of test logic circuits for performing the chain test in a test mode, the plurality of test logic circuits being respectively coupled to the plurality of pads and being disabled to prevent a noise propagation in a normal operation mode; and
    a test output pad for outputting test data generated by the chain test in the test mode.

* * * * *